United States Patent [19]

Coussot

[11] 3,968,462
[45] July 6, 1976

[54] ELECTROMECHANICAL RESONANCE DEVICE AND ITS APPLICATION TO FILTERING OF TELEVISION SIGNALS

[75] Inventor: Gérard Coussot, Paris, France
[73] Assignee: Thomson-CSF, Paris, France
[22] Filed: July 15, 1975
[21] Appl. No.: 596,100

[30] Foreign Application Priority Data
July 19, 1974 France .............................. 74.25171

[52] U.S. Cl. .................................. 333/72; 310/9.5; 310/9.8
[51] Int. Cl.² ..................... H03H 9/26; H03H 9/32; H01L 41/18; H10L 41/08
[58] Field of Search ................. 333/72, 30 R; 310/8, 310/8.1, 8.2, 8.3, 8.5, 9.4, 9.5, 9.8; 252/62.9 R, 62.9 PZ

[56] References Cited
UNITED STATES PATENTS
3,591,813    7/1971    Coquin et al. ....................... 310/9.5

*Primary Examiner*—Alfred E. Smith
*Assistant Examiner*—Marvin Nussbaum
*Attorney, Agent, or Firm*—Cushman, Darby and Cushman

[57] ABSTRACT

The present invention relates to electromechanical resonance devices comprising a piezo-electric crystalline plate and electrodes arranged opposite one another upon the principal faces of said plate. In accordance with the invention, the piezo-electric wafer is cut from a lithium niobate crystal, in accordance with the Y + 37° cut.

5 Claims, 1 Drawing Figure

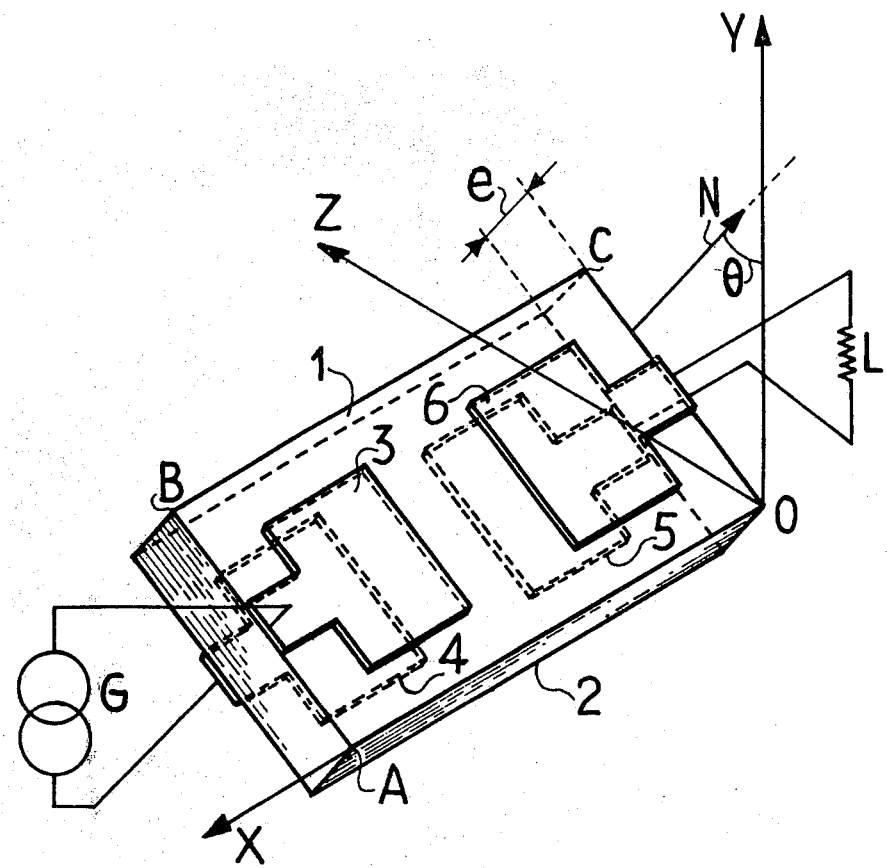

ELECTROMECHANICAL RESONANCE DEVICE AND ITS APPLICATION TO FILTERING OF TELEVISION SIGNALS

The present invention relates to electro-mechanical devices employing a piezo-electric crystalline plate provided on its principal parallel faces with electrodes in order to constitute one or more resonator elements. Two electrodes forming a capacitor and arranged at either side of an elastic plate of a suitably cut piezo-electric material, will excite a vibrational mode across the thickness of the plate. This mode has at least one natural resonance frequency the value of which is associated with the existence of standing waves developing between the principal faces of the plate.

For a given resonance frequency, the thickness of the plate increases with the value of the velocity of propagation of the vibrational waves within the piezo-electric medium of which the plate is made. The electromechanical coupling coefficient is defined as being the square root of the ratio between the mechanical energy stored in a resonator element and the electrical energy applied to its electrodes for excitation purposes. This coefficient depends upon the piezo-electric material from which the wafer is cut, and upon the cut which is used.

In order to form a band-pass filter, on a wafer at least two pairs of electrodes forming coupled resonator elements are assembled. In order for the transmitted frequency band to be sufficiently wide ($\Delta f/f$ 0.5%), it is necessary to use a high electro-mechanical coupling coefficient and this in practice means choosing a piezo-electric crystal as for example lithium niobate.

If the centre frequency of the filter is relatively high then it is a good idea to choose a cut such that the thickness of the cut plate is as large as possible. In other words, in manufacture it must be ensured that the plate is not made too fragile and it must also be contrived that the tolerances on thickness are not too tight in absolute value since this otherwise increases the cost price substantially.

These requirements assume major importance in the case of electromechanical filters designed for the transmission of the I.F. audio carrier wave which forms part of a television signal. In other words, the intermediate frequency chosen for the audio channel is of the order of 40 megahertz and it is necessary, furthermore, to provide a band width of at least 400 kilohertz in order to take account of the inevitable frequency drift occurring in the local oscillator at the tuner, and of the frequency spectrum to be transmitted when angular modulation is being used.

In order to satisfy these requirements, the invention proposes the use of lithium niobate with a cut which produces a particularly good electromechanical coupling coefficient by virtue of a velocity of propagation of the vibrational wave in a direction corresponding to the normal to the principal faces of the cut plate, which is as high as possible.

In accordance with the present invention there is provided: an electromechanical resonator device comprising: a piezo-electric plate cut from a lithium niobate crystal, and positioned on the two principal parallel faces of said piezo-electric plate, at least one pair of mutually opposite electrodes delimiting a resonator element; said piezo-electric plate constituting in relation to the direct system of rectangular crystallographic axes X, Y and Z of said lithium niobate crystal, a Y + 37° cut; the normal to said principal parallel faces forming in relation to the Y axis of said system an angle; the positive value of said angle being substantially equal to 37°; the X axis of said system being substantially parallel to said principal parallel faces.

For a better understanding of the present invention and to show how the same may be carried into effect, reference will be made to the ensuing description and the attached FIGURE which illustrates an isometric view of an electromechanical filter in accordance with the invention.

In the FIGURE there can be seen by way of non-limitative example an electromechanical filter with coupled resonators, comprising a piezo-electric plate of thickness $e$ whose principal faces are marked 1 and 2. This plate is cut from a lithium niobate crystal whose direct rectangular system of crystallographic axes X, Y and Z has likewise been shown in the FIGURE.

Those skilled in the art will be aware that this system of axes X, Y and Z is such that the axis Z coincides with the crystallographic axis c of the crystal and that the axis X is located in the plane defined by the crystallographic axes a and c. The principal face 1 of the piezo-electric plate carries two adjacent conductive deposits 3 and 6 which are, however, electrically insulated. These deposits 3 and 6 do duty as the electrodes of capacitors and are supplemented by similar deposits 4 and 5 on the other principal face 2 of the piezo-electric plate. The capacitor formed by the electrodes 3 and 4 and the intermediate portion of the piezo-electric plate, is a standing wave resonator element which operates in a longitudinal thickness mode. It is electrically excited by the alternating generator G and, as long as the excitation frequency is close to its natural frequency of oscillation, a vibrational mode of substantial amplitude establishes within the elementary volume delimited by the areas of the electrodes 3 and 4. The electrodes 5 and 6 delimit another standing wave resonator element adjacent to the first and connected to a load L. By virtue of the mechanical coupling existing between the respective volumes of the two elementary resonators and because these latter operate in reversible fashion as far as energy conversion is concerned, it will be appreciated that an exchange of electrical energy occurs between the generator G and the load L. This exchange of energy is frequency-selective and the assembly possesses the characteristics of a band-pass filter.

In accordance with the invention, the piezo-electric plate is cut with a Y + 37° cut, this latter furnishing a high electromechanical coupling coefficient associated with a propagation velocity of the order of 7000 m/s in the direction of the normal N, to the principal faces 1 and 2. From a consideration of the FIGURE it can be seen that the normal N and the axis Y make an angle with one another of 0 the value of which is positive and substantially equal to + 37°. In the example illustrated, the rectangular contour ABCO of the principal face 1 is aligned with its length in the direction of the axis X, but this particular orientation of the contour is in no way limitative of the scope of the invention.

By moving the elementary resonators apart and by arranging for a change in thickness in the intermediate zone, it is possible to decouple these resonators mechanically and to arrange that they have different natural frequencies of oscillation. In this case, they can act as resonant dipoles either in an oscillator circuit or in a filter network of one kind or another. The significant properties of the Y + 37° cut are of course retained in these other applications.

By way of a practical embodiment, an electromechanical filter in accordance with the disposition shown in the FIGURE, makes it possible to obtain a pass band of 400 kHz at a centre frequency of 39.2 MHz. The thickness of the piezo-electric wafer of lithium niobate is of the order of 83 microns, corresponding to $\lambda/2$ operation in the case of the longitudinal thickness mode. Without departing from the scope of the invention, it is also possible to achieve $3 \lambda/2$ operation, this resulting in a wafer which is thicker and more robust, but this advantage is bought at the expense of a narrow pass band.

Application as a frequency-selective element in an intermediate frequency transmission channel within a television receiver, is advantageous in circumstances where it is required to effect transmission of the audio carrier using a half wave fundamental mode of operation.

What I claim is:

1. An electromechanical resonator device comprising: a piezo-electric plate cut from a lithium niobate crystal, and positioned on the two principal parallel faces of said piezo-electric plate, at least one pair of mutually opposite electrodes delimiting a resonator element; said piezo-electric plate constituting in relation to the direct system of rectangular crystallographic axes X, Y and Z of said lithium niobate crystal, a y + 37° cut; the normal to said principal parallel faces forming in relation to the Y axis of said system an angle; the positive value of said angle being substantially equal to 37°; the X axis of said system being substantially parallel to said principal parallel faces.

2. An electromechanical device as claimed in claim 1, wherein said plate is equipped on its principal parallel faces with at least two pairs of mutually opposite electrodes delimiting adjacent resonator elements.

3. An electromechanical device as claimed in claim 2, wherein said resonator elements are mechanically coupled with one another and are electrically connected respectively to two pairs of terminals for constituting a band pass filter.

4. An electromechanical device as claimed in claim 1, wherein said resonator element is tuned to a frequency lying within the intermediate frequency range of a television sound carrier wave.

5. An electromechanical device as claimed in claim 4, wherein said resonator element operates in accordance with a longitudinal thickness mode of vibration.

* * * * *